United States Patent
Morales et al.

(10) Patent No.: US 6,458,263 B1
(45) Date of Patent: Oct. 1, 2002

(54) CANTILEVERED MULTILEVEL LIGA DEVICES AND METHODS

(75) Inventors: Alfredo Martin Morales, Pleasanton; Linda A. Domeier, Danville, both of CA (US)

(73) Assignee: Sandia National Laboratories, Livermore, CA (US)

( * ) Notice: Subject to any disclaimer, the term of this patent is extended or adjusted under 35 U.S.C. 154(b) by 35 days.

(21) Appl. No.: 09/677,041

(22) Filed: Sep. 29, 2000

(51) Int. Cl.⁷ .................................................. C25D 5/02
(52) U.S. Cl. ........................ 205/118; 205/123; 205/125; 430/325
(58) Field of Search ................................. 205/118, 125, 205/123; 430/325, 269

(56) References Cited

U.S. PATENT DOCUMENTS

| | | |
|---|---|---|
| 4,661,212 A | 4/1987 | Ehrfeld et al. |
| 5,190,637 A * | 3/1993 | Guckel ........................ 205/118 |
| 5,378,583 A * | 1/1995 | Guckel et al. ............... 430/325 |
| 5,576,147 A | 11/1996 | Guckel |
| 5,718,618 A | 2/1998 | Guckel et al. |

OTHER PUBLICATIONS

Becker et al. (1986), "Fabrication of Microstructures with High Aspect Ratios and Great Structural Heights by Synchrotron Radiation Lithography, Galvanoforming and Plastic Moulding (LIGA Process)," *Microelectronic Engineering*, 4(1):35–56.

Harmening et al. (1992), "Molding of Threedimensional Microstructures by the LIGA Process," *Micro Electro Mechanical Systems '92 Travemüde* (Germany), pp. 202–207.

Ruprecht et al. (1996), "Molding of LIGA Microstructures from Fluorinated Polymers," *Microsystem Technologies* 2:182–185.

Ruprecht et al. (1997), "Various Replication Techniques for Manufacturing Three–Dimensional Metal Microstructures," *Microsystem Technologies* 4:28–31.

* cited by examiner

Primary Examiner—Arun S. Phasge
(74) Attorney, Agent, or Firm—Reed & Associates; J. Elin Hartrum

(57) ABSTRACT

In the formation of multilevel LIGA microstructures, a preformed sheet of photoresist material, such as polymethylmethacrylate (PMMA) is patterned by exposure through a mask to radiation, such as X-rays, and developed using a developer to remove the exposed photoresist material. A first microstructure is then formed by electroplating metal into the areas from which the photoresist has been removed. Additional levels of microstructure are added to the initial microstructure by covering the first microstructure with a conductive polymer, machining the conductive polymer layer to reveal the surface of the first microstructure, sealing the conductive polymer and surface of the first microstructure with a metal layer, and then forming the second level of structure on top of the first level structure. In such a manner, multiple layers of microstructure can be built up to allow complex cantilevered microstructures to be formed.

24 Claims, 4 Drawing Sheets

CANTILEVERED MULTILEVEL LIGA DEVICES AND METHODS

ACKNOWLEDGEMENT OF GOVERNMENT SUPPORT

The United States Government has rights in this invention pursuant to Contract No. DE-AC04-94AL85000 between the United States Department of Energy and Sandia Corporation for the operation of Sandia National Laboratories.

TECHNICAL FIELD

This invention relates generally to the fields of semiconductors and microelectromechanical devices and processing techniques therefor, and particularly to the methods used in formation of metal microminiature structures. More specifically, the invention relates to the fabrication of components of micron or submicron dimensions using conductive polymer compositions containing metallic particles and lithographically or otherwise patterned masks. The invention pertains to miniaturization and "nanotechnology," and has utility in many fields, including microelectromechanical system fabrication and semiconductor processing.

BACKGROUND

Microelectromechanical systems (commonly referred to as "MEMS") are useful in a wide variety of fields and include, for example, micro-sensors, micro-actuators, micro-instruments, micro-optics, and the like. Many MEMS fabrication processes are known, and tend to fall into the two categories of surface micro-machining and bulk-micromachining. The latter technique involves formation of microstructures by etching directly into a bulk material, typically using wet chemical etching or reactive ion etching ("RIE"). Surface micro-machining involves fabrication of MEMS from films deposited on the surface of a substrate, e.g., from thin layers of polysilicon deposited on a sacrificial layer of silicon dioxide present on a single crystal silicon substrate (this technique is commonly referred to as the "thin film polysilicon process").

An exemplary surface micro-machining process is known as "LIGA." See, for example, Becker et al. (1986), "Fabrication of Microstructures with High Aspect Ratios and Great Structural Heights by Synchrotron Radiation Lithography Galvanoforming, and Plastic Moulding (LIGA Process)," *Microelectronic Engineering* 4(1):35–36; Ehrfeld et al. (1988), "1988 LIGA Process: Sensor Construction Techniques via x-Ray Lithography," *Tech. Digest from IEEE Solid-State Sensor and Actuator Workshop*, Hilton Head, S. C.; Guckel et al. (1991) *J. Micromech. Microeng.* 1: 135–138. A related process is termed "SLIGA," and refers to a LIGA process involving sacrificial layers. LIGA is the German acronym for X-ray lithography ("lithographie"), electrodeposition ("galvanoformung") and molding ("abformtechnik"), and was developed in the mid-1970's. LIGA involves deposition of a relatively thick layer of an X-ray resist on a substrate, e.g., metallized silicon, followed by exposure to high-energy X-ray radiation through an X-ray mask, and removal of the irradiated resist portions using a chemical developer. The mold so provided can be used to prepare structures having horizontal dimensions— i.e., diameters—on the order of microns. The technique is now used to prepare metallic microcomponents by electroplating in the recesses (i.e., the developed regions) of the LIGA mold. See, for example, U.S. Pat. Nos. 5,190,637 to Guckel et al. and 5,576,147 to Guckel et al.

Unfortunately, one of the serious disadvantages of LIGA is that, unlike silicon MEMS, there is currently no way to easily and economically build multilevel LIGA devices, particularly cantilevered multilevel LIGA devices. Standard LIGA processes can only fabricate microparts that are essentially extrusions of 2-D designs. In other words, standard LIGA parts are currently prismatic. In order to microfabricate a cantilevered part, prismatic LIGA components are microfabricated separately and glued or diffusion bonded together in the proper orientation. Such post fabrication assembly raises the cost of the device considerably and results in cantilevered parts having discontinuities between the glued or diffusion bonded layers. Previous attempts at manufacturing cantilevered multi-layered LIGA microstructures, such as those discussed in U.S. Pat. No. 5,378,583 to Guckel et al., have been significantly hampered by the high interfacial stresses between the exposed and unexposed areas of photoresist that leads to extensive crack propagation when the exposed areas are developed.

U.S. Pat. No. 5,190,637 to Guckel et al. discloses a method of producing a cantilevered multi-layer microstructures by utilizing a sacrificial metal layer to surround each layer of microstructure once it has been formed. However, the formation of microstructures using this method requires a separate time-consuming electroplating step to be performed at each level, and a difficult final etching step to be performed in order to remove the sacrificial metal, thereby increasing the complexity and expense of the metal microstructure fabrication process. There is, therefore, a need in the art for a fast and efficient method of manufacturing continuous cantilevered multilevel LIGA microstructures that avoids the problems associated with interfacial stresses and time-consuming metal etching techniques.

SUMMARY OF THE INVENTION

Accordingly, the invention is directed to the aforementioned need in the art and provides a method that reduces the occurrence of stress-induced cracking when making continuous multilevel cantilevered LIGA microstructures of micron or submicron dimensions and eliminates the need for time-consuming metal etching processes.

It is another object of the invention to provide such a method that involves forming a first microstructure on the plating base, covering the first microstructure with a conductive polymer, sealing the conductive polymer with a metal layer, and forming a second microstructure on the first microstructure.

It is still a further object of the invention to provide novel microcomponents fabricated using the methodology disclosed and claimed herein.

Additional objects, advantages and novel features of the invention will be set forth in part in the description which follows, and in part will become apparent to those skilled in the art upon examination of the following, or may be learned by practice of the invention.

In one embodiment, then, the invention pertains to a method of forming multi-layer microstructures. In the method a first layer microstructure is established by electroplating a metal into the recesses of an exposed and developed first polymer layer and planarizing the surface of the electroplated metal to form a substantially flat and uniform surface extending across the first layer microstructure and the remaining first polymer layer. The remaining first polymer layer is then removed in its entirety. A conductive polymer layer is deposited over the first layer microstructure. The conducting polymer mitigates stress induced cracking and serves as a plating base for any cantilevered portions of the second level microstructure. The exposed surface of the conducting polymer layer is machined down to expose the surface of the first layer microstructure, forming a substantially flat, uniform surface extending across the first layer microstructure and conducting polymer layer. Machining also allows the thickness of the first layer of metal to be closely controlled.

After the first layer microstructure and conducting polymer layer have been machined down to the desired height, a metal sealing layer is deposited onto the surface of the first layer microstructure and conducting polymer layer. This metal sealing layer prevents the chemical developer used in forming the subsequent layers of microstructure from attacking the conductive polymer layer. Additional layers of microstructure are then formed using the same procedure outlined above. i.e., a second polymer layer is deposited on the metal sealing layer, areas of the second polymer layer are exposed and developed. Prior to electroplating, the areas of metal sealing layer that have been uncovered by the development of the exposed areas of the second polymer layer are also removed. The removal of areas of the metal sealing layer allows the electroplated microstructures of the second layer to form directly onto the surface of the first layer microstructure or, when the microstructure is cantilevered, onto the surface of the conductive polymer.

Using the above method, a multi-layered microstructure may be quickly and economically formed. If so desired, additional layers of microstructure may be added by covering the previous layer of microstructure with a conductive polymer layer and a metal sealing layer. The utilization of the conductive polymer layer and metal sealing layer to completely cover each layer of microstructure facilitates both the machining of newly formed microstructures and the development of cantilevered parts. The conductive polymer layer or layers may be removed from around the final microstructure by any suitable chemical and/or thermal method, i.e., dissolution in acetone or other organic solvent, heating, burning, etc.

DETAILED DESCRIPTION OF THE INVENTION

Figure 1:
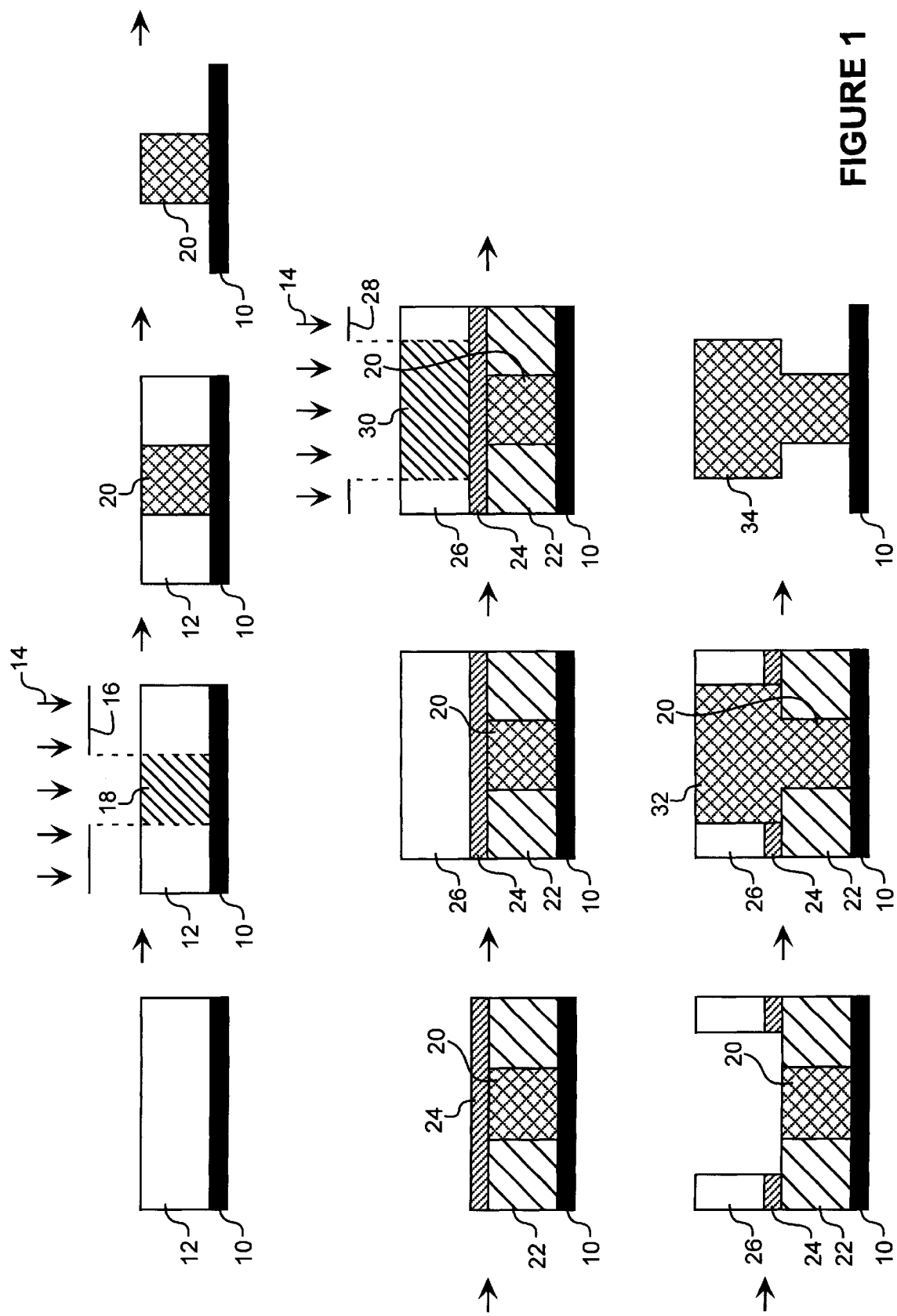
FIG. 1 schematically illustrates fabrication of multilevel cantilevered microstructures according to the invention.

Definitions and Overview:

Before describing the present invention in detail, it is to be understood that unless otherwise indicated, this invention is not limited to specific materials (e.g., specific polymers or metals), processing conditions, manufacturing equipment, or the like, as such may vary. It is also to be understood that the terminology used herein is for the purpose of describing particular embodiments only, and is not intended to be limiting.

It must be noted that, as used in this specification and the appended claims, the singular forms "a," "an" and "the" include plural referents unless the context clearly dictates otherwise. Thus, for example, reference to "a curable polymer" includes mixtures of curable polymers, reference to "a microstructure" includes two or more microstructures, and the like.

In describing and claiming the present invention, the following terminology will be used in accordance with the definitions set out below.

The term "polymer" is used herein. in its conventional sense to refer to a compound having two or more monomer units, and is intended to encompass homopolymers as well as copolymers and polymer blends. Those polymers herein that are referred to as "curable" are capable of becoming crosslinked, either thermally, chemically or photolytically, so that a cured polymeric matrix may be provided.

The terms "microstructure," "micropart" and "microcomponent" are used interchangeably herein to refer to a three-dimensional solid structure whose height, width (or diameter) or length is less than about 100 microns, i.e., at least one dimension of the three-dimensional structure is less than about 100 microns.

The term "aspect ratio" is used herein in its conventional sense to refer to the ratio of an object's height to its width (or diameter). High aspect ratio structures are thus prepared using molds (such as LIGA molds) having voids, or recesses, that are extremely narrow relative to their height.

Preparation of Multilayered Microstructures:

The invention thus features a method for preparing multi-layered microstructures using LIGA micro-machining processes. The method is capable of producing cantilevered microparts without post processing gluing or diffusion bonding of separately processed microcomponents or electroplating of additional sacrificial metal layers. Using the method of the invention, it is possible to fabricate entire systems of devices from a single substrate.

In the method, a plating base is initially provided. This plating base may be a metal substrate, a silicon or glass substrate, a thick photoresist sheet, or a variety of other materials, including a silicon semiconductor wafer with or without electronic circuitry thereon. If an insulating substrate is utilized, metallic layers may be bonded to the surface of the wafer in order to provide conductive means or in order to create a "sacrificial" metal layer. The use of sacrificial metal layers to form movable microstructures is presented in U.S. Pat. No. 5,190,637 to Guckel et al. The metal layers can be deposited by any conventional method, i.e., thermal evaporation, e-beam, sputtering, or the like.

In one embodiment, a tri-layered metal laminate is deposited onto the surface of a silicon wafer to form the plating base. The first metal layer provides an adhesion layer that assists in the application of the plating layer which constitutes the center layer. The final layer improves adhesion of the polymer layer that is subsequently deposited onto the plating base and protects the inner plating layer from the chemicals used to develop the exposed polymer layer. Each of the metal layers has a thickness in the range of about 500 Å to about 5000 Å, preferably about 1000 Å to about 2000 Å. A titanium-copper-titanium laminate is the preferred laminate, although other laminates such as titanium-nickel-titanium or chromium-copper-chromium, etc. may be used.

Once the plating base has been provided, a first level microstructure is formed on the plating base. As will be appreciated by those skilled in the art, preparation of a LIGA fabricated microstructure involves deposition of a first polymer layer of an X-ray radiation degradable polymer on a plating base having a conductive surface, which may or may not be pretreated with an adhesion-promoting layer such as a metal oxide (e.g., oxides of titanium and/or copper) or with a silanization reagent such as methacryloxypropyl trimethoxysilane, to facilitate adhesion of the resist to the surface of the plating base.

Suitable polymers degradable by X-ray radiation may comprise, for example, poly(methylmethacrylate) ("PMMA") or copolymers thereof such as poly(methyl methacrylate-co-t-butylmethacrylate), a poly(lactide) such as poly(lactide-co-glycolide), polymethacrylamide, polyoxymethylene, polyalkenesulfone, or poly(glycidylmethacrylate-co-ethyl acrylate). The polymer layer is deposited using any of a number of conventional techniques,. e.g., sequential spin coating or the like.

In a preferred embodiment, an adhesive composition is spin coated or otherwise deposited onto the plating base, thickened by removal of the solvent or optionally cured using a suitable curing agent to form an adhesive layer and then covered with a preformed sheet of PMMA. Suitable adhesive compositions will be well known to those skilled in the art and include solutions of poly(methylmethacrylates) and copolymers thereof. A particularly preferred adhesive composition is a solution of 5% w/w high molecular weight PMMA, i.e., PMMA having a MW of at least 2,000 kD, in chlorobenzene. The adhesive composition may be cured using a suitable chemical agent and/or heating (generally in the presence of a cross-linking agent) or may be hardened by solvent removal. For 5% w/w PMMA, the composition may be hardened by heating to around 180° C. for a minimum of about 1 hour, preferably for at least 2 hours or, alternatively, may be heating to around 55° C. under vacuum for a time sufficient to remove the solvent. Those skilled in the art will appreciate that the length of time required to evaporate the solvent or crosslink the polymer is a function of temperature and/or vapor pressure, e.g., long periods of time are required at lower temperatures and higher atmospheric pressures.

A preformed sheet of PMMA is then solvent bonded to the cured polymer layer thus forming the first polymer layer. Preformed sheets of PMMA are commercially available, i.e. from Goodfellow Corporation, Berwyn, Pa. or Rohm GmbH, Darmstadt, Germany. Adhesion between the PMMA sheet and the adhesive layer may be readily obtained by utilizing a methylmethacrylate (MMA) monomer liquid applied to the interface between the preformed sheet and the adhesive layer. Those skilled in the art will appreciate that other monomer liquids (optionally containing additives, particularly cross-linking agents) will also be suitable to bond the polymer sheet to the adhesive layer.

Once adhered to the plating base, the first polymer layer may be mechanically worked, as by milling, to reduce the thickness of the first polymer layer to a precise height above the surface of the plating base, e.g., by using commercially available micromilling equipment. Generally the first polymer layer will be milled to a height in the range of about 100 $\mu$m to about 800 $\mu$m, with a range of about 200 $\mu$m to about 400 $\mu$m being more customary.

The deposited first polymer layer is irradiated using X-ray radiation, such as from a synchrotron, and an X-ray mask to provide the desired pattern of exposed, dissolvable areas. Following exposure, the first polymer layer is developed using a suitable solvent to remove the irradiated areas. A preferred developing solvent, known as "GG developer," is comprised of 60% v/v diethyl glycol butyl ether, 20% v/v morpholine 5% v/v ethanolamine, and 15% v/v water. Other suitable developing solutions are known in the art and are discussed in Madue (1995) *Fundamentals of Microfabrication*, CRC Press, Inc. p.291. The resulting mold is comprised of a substrate having a patterned relief structure on the substrate surface made up of elevated segments (i.e., the undeveloped resist) with corresponding voids therebetween.

If a tri-layered laminate has been applied to the plating base, the upper layer exposed by the removal of the irradiated areas of the first polymer layer is also removed to expose the mid-layer underneath. The upper layer may be removed by any conventional method including plasma etching, wet etching or the like.

The resultant first level mold is then electroplated using conventional electroplating techniques with a selected metal or metal alloy such as Cu, Au, Ni, FeNi, Pt, Ag, NiCo, or the like. Typically, the metal is overplated and then lapped and polished to form a substantially planar surface of the desired final thickness. Suitable lapping methods are disclosed in U.S. Pat. No. 7,718,618 to Guckel et al. and are well known in the art. The remaining unexposed areas of the first polymer layer may be removed using any suitable chemical and/or thermal method, i.e., dissolution in acetone or in any suitable organic solvent, heating, dissolution in heated solvent, ashing in an oxygen plasma or the like.

It should be noted that the first level microstructures may also be fabricated using other techniques, as alluded to above. LIGA methods are preferred, however, insofar as such methods can provide high aspect ratio microstructures. The aspect ratio of the microstructures prepared herein, using LIGA molds, can be 20:1 or even 40:1 or higher.

Next, the first level microstructure is covered and surrounded by a layer of conductive polymer comprised of conductive particles in a suitable polymer. The conductive polymer is generally deposited as a curable polymer that is then allowed to crosslink for a suitable amount of time at room temperature, usually at least about an hour. Once properly cured, the conductive polymer is machined down to a substantial planar surface at a level sufficient to expose the surface of the first layer microstructure. It is generally preferred that prior to polymer deposition, the exposed surface of the first level microstructure is treated with an adhesion-promoting layer as discussed above.

The conductive particles comprise in the range of about 60% w/w to about 80% w/w of the conductive polymer, preferably in the range of about 65% w/w to about 75% w/w and most preferably comprise about 70% w/w of the conductive polymer. Additives such as adhesion promoters may also be included. Suitable conductive particles include, silver, copper, gold, carbon powders, or mixtures thereof, and are not greater in diameter than the smallest feature in the desired final microstructure. A particularly suitable metal particle is Silver Flake, from Alcatan Metal Powders. The presence of the conducting particles serves to decrease the coefficient of thermal expansion, thus reducing interfacial stresses caused by exposure to the radiation source. The polymer element of the conductive polymer may be any polymer that can be chemically and/or thermally removed from the electroplated microstructure without causing damage to the microstructure. Generally, however, the polymer will be PMMA or a copolymer thereof as such polymers are readily available and easily removed. A PMMA/silver composition is preferred.

The upper surface of conductive polymer and the exposed surface of the first layer microstructure are then covered by a metal sealing layer. The metal layer hermetically seals the surface of the conductive polymer, protecting it from the developer used later during the process. The metal layer may be of any metal that adheres well to the conducting polymer and is easily removable. Titanium is preferred as it is readily removable with gas etching. The metal layer may be applied by thermal evaporation and will be in the range of about 100 Å to about 2000 Å in thickness, normally in the range of about 500 Å to about 1500 Å, and generally about 1000 Å thick.

A second polymer layer is then deposited onto the metal sealing layer or onto an adhesion-promoting layer as above, deposited on the metal sealing layer. The first and second polymer layers may be the same or different, but will generally be the same. In order to avoid delamination of the metal sealing layer, excessive heating can not be used during the curing or solvent removal of the second adhesive layer. For example, when the 5% v/v PMMA adhesive composition is used, the solvent is removed by heating to about 55° C. under vacuum for a period of at least about 24 hours, preferably for at least about 2 days. Once the second adhesive composition is applied and suitably cured or hardened, the second polymer sheet is solvent bonded to the second adhesive layer thereby forming the second polymer layer. The second polymer sheet may be milled to a desired height either before or after bonding to the second adhesive layer.

The second polymer layer is subsequently irradiated using X-ray radiation, such as from a synchrotron, and an X-ray mask to provide the desired pattern of exposed, dissolvable areas. Alignment of the X-ray masks used in the photoresist layers can be obtained by creating fiducial marks or mechanical alignment structures during exposure of each layer and then using these alignment structures or fiducial marks to obtain mechanical registration between each layer and a subsequent layer. Optical alignment methods are also known in the art and may be used as well.

Following exposure, the second polymer layer is developed using a suitable solvent, as discussed above. Removal of the irradiated areas in the second polymer layer reveals the underlying areas of the metal sealing layer which are then removed via plasma etching. The portions of the conductive polymer and first level microstructure revealed when areas of the metal sealing layer are removed serve as the plating base for the second level microstructure. The cantilevered areas of the second level microstructure are plated onto the surface of the exposed portions of the conductive polymer layer. As before, the second level microstructure is overplated and then lapped and polished to a desired height.

Finally, the remainder of the unexposed second polymer layer, the metal sealing layer and the conductive polymer layer are removed, leaving behind the multi-layered LIGA microstructure. The unexposed second polymer layer, the metal sealing layer and the conductive polymer layer may all. be removed as discussed above. If desired, the process can be repeated so as to add additional microstructure levels.

The method of the invention is illustrated schematically in FIG. 1, where the plating base is shown generally at 10. The first polymer layer 12 is deposited onto the plating base 10 and exposed to a radiation source 14, such as from a synchrotron, and a patterning mask 16 to provide the desired pattern of dissolvable areas in the first polymer layer 18. The dissolvable areas 18 are removed and the resulting void electroplated, thus forming the first level microstructure 20. The remaining areas of the first polymer layer are removed to reveal the first level microstructure 20.

Next, the first level microstructure 20 is covered and surrounded by a conductive polymer layer 22 and once the conductive polymer layer has been lapped and polished to expose the surface of the first level microstructure 20, a metal sealing layer 24 is applied. Second polymer layer 26 is deposited on the metal sealing layer 24 and a pattern of dissolvable areas in the second polymer layer 30 is provided by exposure to radiation source 14 and a second patterning mask 28. When the dissolvable areas in the second polymer layer 30 are removed, underlying areas of metal sealing layer 24 are exposed. The exposed areas of the metal sealing layer are then removed, revealing the underlying areas of the conductive polymer layer 22 and the first level microstructure 20. The second level microstructure 32 is electroformed into the void provided by the removal of the dissolvable areas of the second polymer layer and the underlying metal sealing layer. The remaining portions of the second polymer layer 26, the metal sealing layer 24 and the conductive polymer layer 22 are then removed, providing the finished multi-layered cantilevered LIGA microstructure 34.

Prior to use, the microstructures are optionally removed from the substrate surface, e.g., mechanically, chemically, and/or by removal of any sacrificial release layer that may be incorporated. A poly(methyl methacrylate) release layer can be removed, for example, by immersion in a PMMA solvent such as acetone. If the-microstructures are to be used on the base, the base area surrounding each microstructure may be etched or otherwise treated so as to electrically isolate each microstructure.

The processes of the invention thus provide multi-level microstructures, i.e., microcomponents having micron or submicron dimensions. The present method is readily scaled up to provide a viable manufacturing process for the fabrication of such microstructures. The method allows for the formation of continuous cantilevered microparts having all the benefits of LIGA methods. That is to say, the method allows for the fabrication of cantilevered, high aspect ratio components that are free from discontinuities, and does not require the use of a sacrificial metal layer to surround and cover each fabricated layer of microstructures. The invention is useful in a host of applications and technical fields, including MEMS fabrication and semiconductor processing, information storage, medical diagnostics, optics, and the manufacture of structural materials. For example, the present invention is useful in the preparation of mirrors, fiber positioners, multiplexers, demultiplexers, switches, variable capacitors, transformers, and the like.

It is to be understood that while the invention has been described in conjunction with the preferred specific embodiments thereof, the foregoing description, as well as the examples which follow, are intended to illustrate and not limit the scope of the invention. Other aspects, advantages and modifications will be apparent to those skilled in the art to which the invention pertains. All patents, patent applications, journal articles and other references cited herein are incorporated by reference in their entireties.

The following example is put forth so as to provide those of ordinary skill in the art with a complete disclosure and description of how to make and use the materials of the invention, and is not intended to limit the scope of what the inventors regard as their invention. Efforts have been made to ensure accuracy with respect to numbers (e.g., amounts, temperature, etc.) but some errors and deviations should be accounted for. Unless indicated otherwise, parts are parts by weight, temperature is in °C. and pressure is at or near atmospheric.

EXAMPLE

For the first level, a pre-fabricated copper microstructure was used. The substrate was a 3 mm thick copper plate and the existing copper microstructure was a 1 mm thick pattern. The first level microstructure was covered in conducting poly(methylemethacrylate) "PMMA" containing 70% w/w silver particles (Silver Flake, Alcatan Metal Powders) mixed with a PMMA based adhesive (PS-30 Acrylic Adhesive, Caseway Industruial Products). The conducting PMMA was lapped and polished until the first level microstructure broke through the surface.

The conducting PMMA and surface of the first level microstructure were coated with approximately 1000 Å of titanium by thermal evaporation. A layer of high molecular PMMA (Nano 2200 PMMA C5, manufactured by Micro- Chem Corp., Newton Mass.) was spin coated onto the titanium layer. The spun PMMA was thickened by heating at 55° C. for two days under rough vacuum (50 mTorr). Sheet PMMA (1.6 mm thick Clinical Grade from Goodfellow, Berwyn, Pa.) was solvent bonded with methylmethacrylate (99% pure, Aldrich Chemical, Milwaukee, Wis.) and flycut down to 500 μm.

An X-ray mask containing a gear pattern for a rotary motor was placed onto the surface of the sheet PMMA and the PMMA and mask were placed in a standard aluminum exposure frame. The PMMA and mask assembly were then exposed to the X-ray radiation at the Stanford Synchrotron Radiation Laboratory. The exposed PMMA was then chemically developed using the standard LIGA GG developer (60% diethyl glycol butyl ether, 20% morpholine, 5% ethanolamine, and 15% water, all by volume).

Two innovative aspect of the inventive process are evident at this point. First, in previous attempts at multilevel LIGA, the PMMA or polymer surrounding the first level microstructure inevitably gets exposed to the X-ray radiation. Because of the difference in density between the exposed and the unexposed PMMA, the exposed PMMA would crack. In the present process, since the PMMA surrounding the first level PMMA was 70% silver, the density change of the exposed areas was not sufficient to cause mechanical failure. The second innovation involves the titanium seal which prevented the GG developed from attacking the exposed conducting PMMA.

Next, the titanium seal accessible through the developed areas of the exposed PMMA was plasma etched with fluorine (150 W, 50 mTorr, 100 SCCM, $CF_4$).

The second level microstructures were then electroformed using a copper sulfate bath (Cubath, Enthone-OMI, Conn.). The cantilevered parts of the second level microstructures were plated from the conducting PMMA. The non-cantilevered parts were plated directly from the first level microstructure without discontinuity. The second level microstructure was then lapped and polished to about 480 μm.

Figure 2:
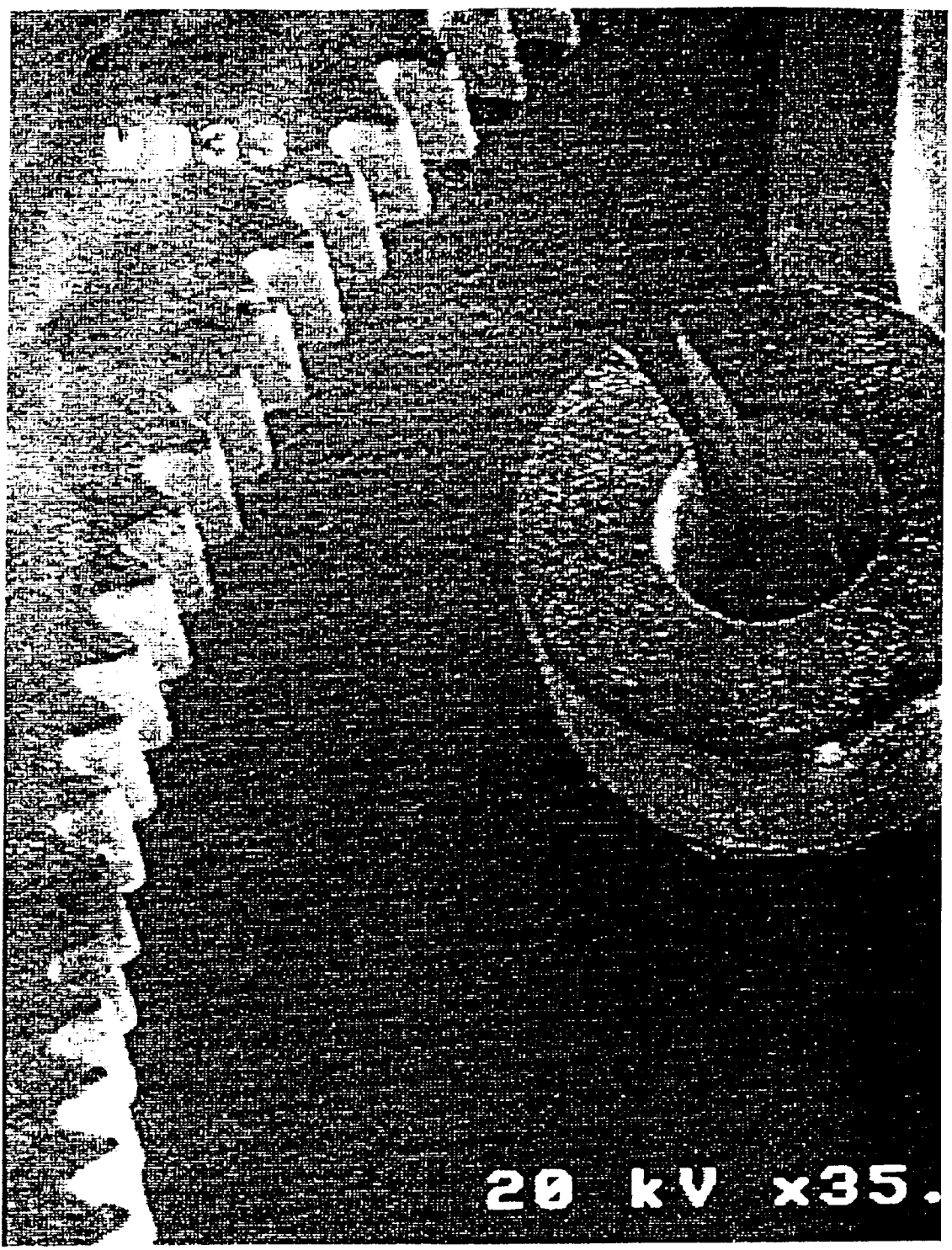
FIGS. 2, 3, and 4 are SEM photographs of the microparts prepared in Example 1, magnified 35×, 35× and 100×, respectively.
Figure 3:
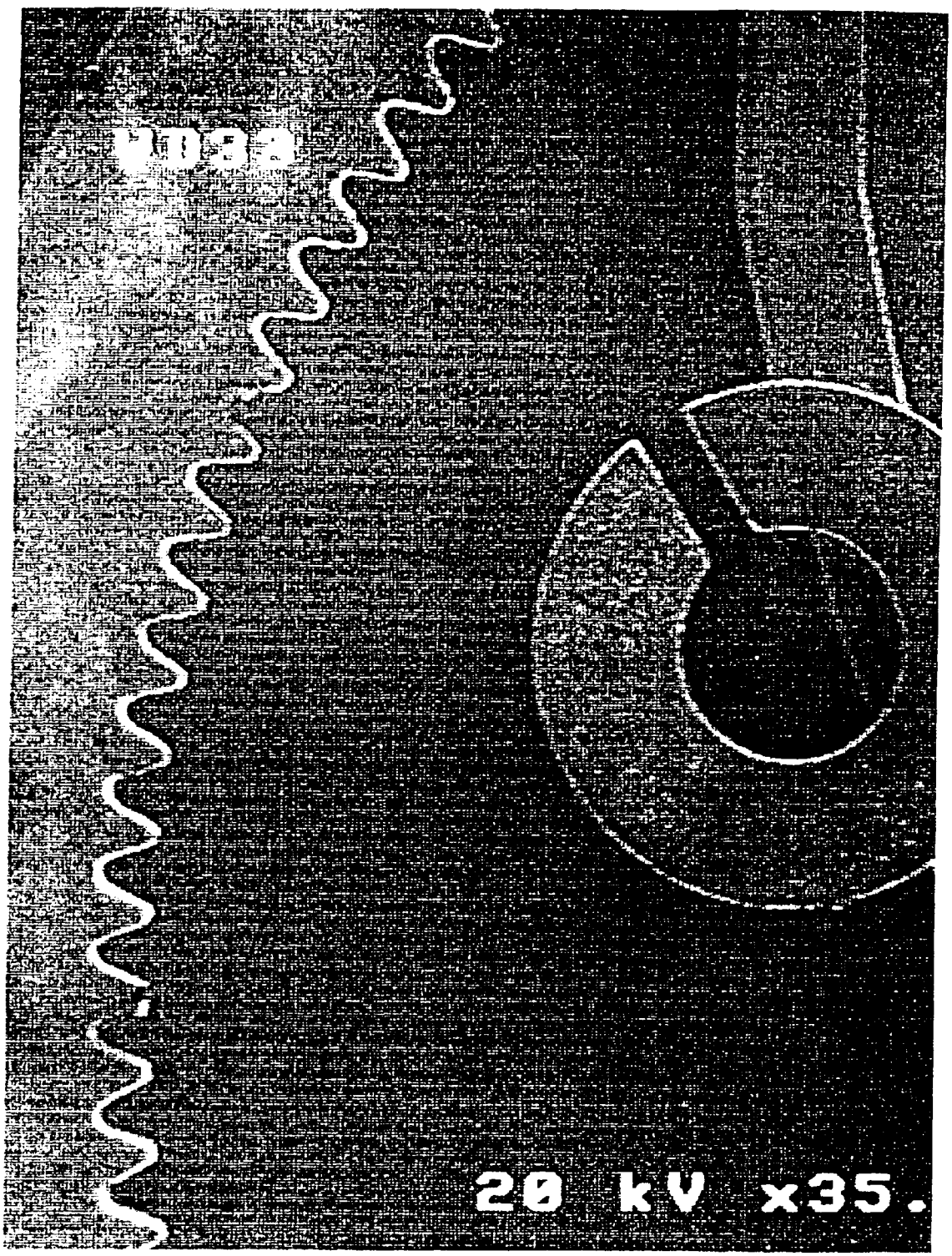
Figure 4:
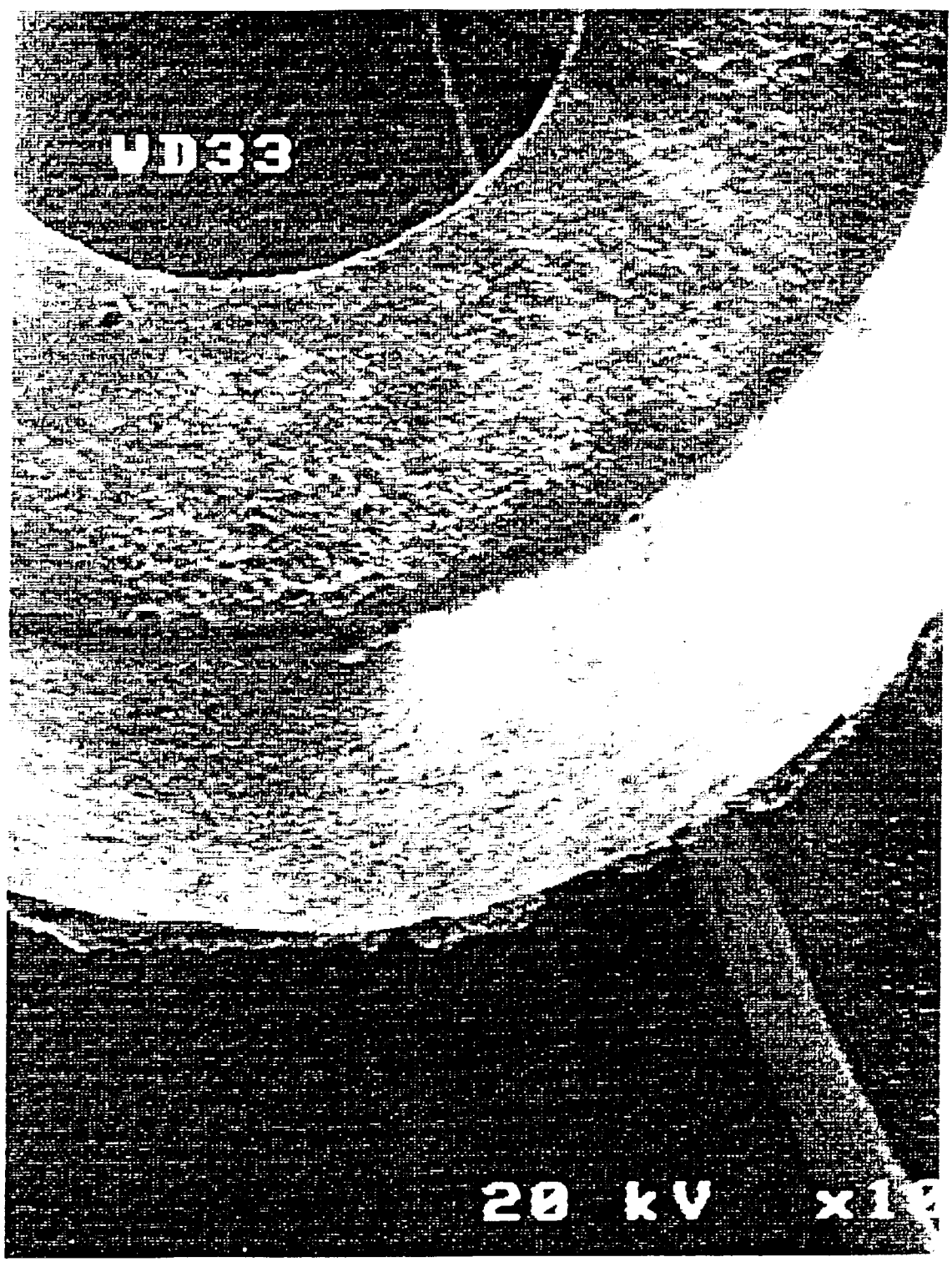

The first level conducting PMMA and the second level PMMA was then dissolved (one day in acetone and another day in methylene chloride) resulting in a two level part. The remaining titanium sealing layer was plasma etched away as before. SEM photographs of the prepared microstructures, magnified 35×, 35× and 100×, are presented in FIGS. 2, 3 and 4, respectively.

What is claimed is:

1. A method of forming a multi-layered LIGA microstructure on a plating base comprising the steps of:
   (a) providing a first level microstructure having raised conductive portions;
   (b) covering and surrounding the first level microstructure with a conductive polymer layer;
   (c) machining the conductive polymer layer to a desired level so as to reveal the surface of the first level microstructure;
   (d) coating the conductive polymer layer and the surface of the first level microstructure with a metal sealing layer;
   (e) depositing a second polymer layer onto the metal sealing layer;
   (f) exposing portions of the second polymer layer to a radiation source to provide a pattern of dissolvable portions in the second polymer layer;
   (g) removing the dissolvable portions in the second polymer layer to provide accessible underlying areas of the metal sealing layer;
   (h) removing the accessible underlying areas of the metal sealing layer to provide accessible underlying areas of the first microstructure and the conductive polymer layer;
   (i) electroplating a second layer of metal onto the accessible underlying areas of the first microstructure and the conductive polymer layer;
   (j) machining the electroplated metal to provide a substantially planar surface;
   (k) removing the remainder of the second polymer layer; and
   (l) removing the metal sealing layer and the conductive polymeric layer to provide a multi-layered microstructure.

2. The method of claim 1, wherein steps (e) through (k) are repeated resulting in a multi-layered LIGA microstructure having at least three layers.

3. The method of claim 1, wherein the first and second polymer layers comprise first and second adhesive layers bonded to first and second polymer sheets, respectively.

4. The method of claim 3, wherein the first and second polymer sheets are machined to a desired thickness.

5. The method of claim 3, wherein the first and second adhesive polymers are applied as first and second adhesive compositions that are each either cured or thickened prior to coverage by the first and second polymer sheets.

6. The method of claim 5, wherein the first and second adhesive compositions are comprised of polymethylmethacrylate.

7. The method of claim 3, wherein the first polymer sheet is comprised of polymethylmethacrylate.

8. The method of claim 3, wherein the second polymer sheet is comprised of polymethylmethacrylate.

9. The method of claim 3, wherein the first and second polymer sheets are solvent bonded to the respective first and second cured polymeric layers.

10. The method of claim 3, wherein the first and second polymer sheets are machined to a desired thickness.

11. The method of claim 3, wherein the radiation source is a synchrotron.

12. The method of claim 1, wherein the first layer microstructure comprises alignment means.

13. The method of claim 1, wherein the conductive polymer is comprised of polymethylmethacrylate containing conductive particles in the range of about 60% w/w to about 80% w/w.

14. The method of claim 13, wherein the conductive particles are silver particles and comprise 70% w/w of the conductive polymer.

15. The method of claim 1, wherein the metal layer comprises approximately 1,000 Å of Ti.

16. The method of claim 1, further including (m) removing the microstructure from the base.

17. A method of forming a multi-layered LIGA microstructure on a plating base comprising the steps of:
   (a) depositing a first polymer layer comprised of a first radiation-degradable polymer onto the plating base;
   (b) exposing the first polymer layer in a pattern to a radiation source to provide a pattern of dissolvable portions in the first polymer layer;
   (c) removing the pattern of dissolvable portions in the first polymer layer to reveal exposed areas of the plating base;
   (d) electroplating a first layer of a metal onto the exposed areas of the plating base;
   (e) machining the electroplated metal to provide a substantially planar surface;

(f) removing the remainder of the first polymer layer to provide a first level microstructure;

(g) covering and surrounding the first level microstructure with a conductive polymer layer;

(h) machining the conductive polymer layer to a desired level so as to reveal the surface of the first level microstructure and provide a substantially planar surface;

(i) coating the conductive polymer layer and the surface of the first level microstructure with a metal sealing layer;

(j) depositing a second polymer layer onto the metal sealing layer;

(k) exposing the second polymer layer in a pattern to a radiation source to provide a pattern of dissolvable portions in the second polymer layer;

(l) removing the dissolvable portions-in the second polymer layer to provide accessible underlying areas of the metal sealing layer;

(m) removing the accessible underlying areas of the metal sealing layer to provide accessible underlying areas of the first microstructure and the conductive polymer layer;

(n) electroplating a second layer of metal onto the accessible underlying areas of the first microstructure and the conductive polymer layer;

(o) machining the electroplated metal to provide a substantially planar surface;

(p) removing the remainder of the second polymer layer; and (q) removing the metal sealing layer and the conductive polymeric layer to provide a multi-layered microstructure.

18. The method of claim 17, wherein steps (i) through (p) are repeated resulting in a multi-layered LIGA microstructure having at least three layers.

19. The method of claim 18, wherein the plating base is comprised of a tri-layered laminate.

20. The method of claim 19, wherein the tri-layered laminate is comprised of upper and lower titanium layers and a copper mid-layer.

21. The method of claim 19, wherein the upper and lower titanium layers and the copper mid-layer each have a thickness in the range of approximately about 1000 Å to about 2000 Å.

22. The method of claim 18, wherein the upper layer of the tri-layered laminate is removed from the exposed portions of the plating base in step (c).

23. The method of claim 17, further including (r) removing the microstructure from the base.

24. A method of forming a multi-layered LIGA microstructure on a plating base comprising the steps of:

(a) forming a first microstructure on the plating base;

(b) covering the first microstructure with a conductive polymer layer;

(c) machining the conductive polymer layer to expose the surface of the first microstructure;

(d) sealing the conductive polymer and the surface of the first microstructure with a metal layer; and (e) forming a second microstructure on top of the first microstructure and the conductive polymer layer.

* * * * *